United States Patent [19]

Tien

[11] 4,136,350
[45] Jan. 23, 1979

[54] EPITAXIAL GROWTH OF DISSIMILAR MATERIALS

[75] Inventor: Ping K. Tien, Chatham Township; Morris County, N.J.

[73] Assignee: Bell Telephone Laboratories, Incorporated, Murray Hill, N.J.

[21] Appl. No.: 815,720

[22] Filed: Jul. 14, 1977

[51] Int. Cl.² .................. H01L 29/161; H01L 33/19
[52] U.S. Cl. ........................................ 357/16; 357/18; 357/4; 357/61; 350/96.11; 350/96.14
[58] Field of Search ................... 357/17, 18, 16, 4, 61, 357/19; 350/96 WG

[56] References Cited

U.S. PATENT DOCUMENTS

| 3,764,195 | 10/1973 | Blank | 350/96 |
| 4,032,951 | 6/1977 | De Winter | 357/17 |

*Primary Examiner*—Martin H. Edlow
*Attorney, Agent, or Firm*—Daniel D. Dubosky

[57] ABSTRACT

A method of epitaxial crystal growth is disclosed in which the lattice constants of adjacent layers are in the ratios of small integers other than one. This method permits the use of previously incompatible compounds, in particular the combination of magneto optic and electro optic elements on the same substrate.

6 Claims, 4 Drawing Figures

EPITAXIAL GROWTH OF DISSIMILAR MATERIALS

BACKGROUND OF THE INVENTION

Epitaxial growth of crystals will be understood to mean growth in which crystal structure of one crystal extends smoothly into an adjacent crystal. In the prior art, only compounds the lattice constants of which were equal or nearly equal were thought to be suitable for epitaxial growth.

The purpose of epitaxial crystal growing has been to provide extremely high quality crystals comprising layers of different chemical composition, for use in transistors, other semiconductor devices are integrated optics devices. It has been found that nonepitaxial crystal growth produces crystals with cracks, voids and other defects that impair the operation of these devices and result in their eventual failure.

Because nonepitaxial crystals were unsatisfactory, and epitaxial growth was thought to be restricted to combinations of materials with lattice constants that matched exactly or nearly so, the prior art was unable to combine chemical compounds that, otherwise, could offer promise of improved performance in a wide variety of applications. In particular, in the field of integrated optics, it has not previously been possible to combine III-V compounds for semiconductor devices and garnets and other magnetically suitable materials, and therefore it has not been possible to combine magnetic and electric devices on the same substrate. In the manufacture of electrical devices, also, the method taught by this invention will offer better choices of the materials.

One prior art method of combining materials of different lattice constants is disclosed in U.S. Pat. No. 4,032,951 issued to J. C. DeWinter et at on June 28, 1977, that discloses a method of epitaxial growth in which a layer of graded chemical composition forms a transition zone between two crystals of different lattice constants.

SUMMARY OF THE INVENTION

The invention relates to epitaxially grown solid state devices comprising two or more layers of differing chemical composition, which layers have lattice constants that are in the ratio of small integers other than one.

One feature of the invention is the provision of solid state electronic and optical devices comprising layers of materials previously not combined.

Another feature of the invention is the fabrication of integrated-optics devices comprising both electrooptic and magnetooptic devices grown on the same substrate.

DETAILED DESCRIPTION

Figure 1:
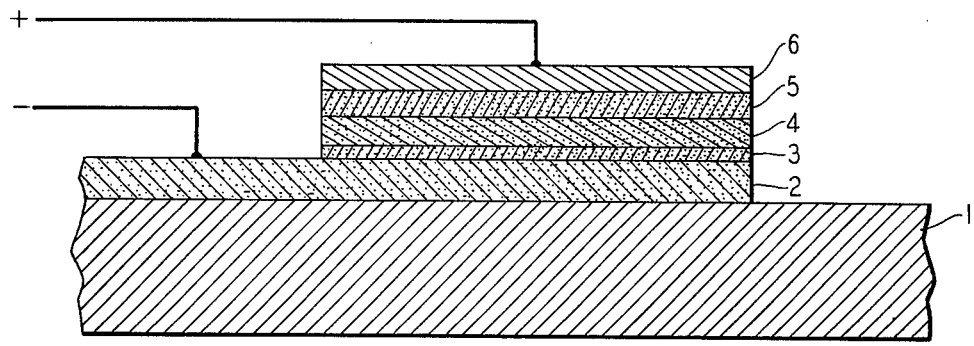
FIG. 1 shows an injection diode laser constructed according to the invention.

As an illustration of an apparatus constructed according to the invention, consider the double heterostructure injection diode laser shown in FIG. 1, in which a garnet substrate 1, which is suitable for magnetooptic devices, has an epitaxially grown layer of an n-type III-V semiconductor 2 that is conductive and serves both as the n-buffer layer and as one contact. The double heterostructure of the diode laser includes an active region 3, p-cladding layer 4, $p^+$ layer 5 and contact 6 in conventional fashion.

Illustratively, substrate 1 is Yttrium Aluminum Garnet (YAG) having a lattice constant of 12 Angstroms and the III-V compound of layer 2 is AlInAs, compounded to have a lattice constant of 6 Angstroms and an energy gap of 0.68 eV, capable of emitting radiation at 1.82 μm.

Figure 2:
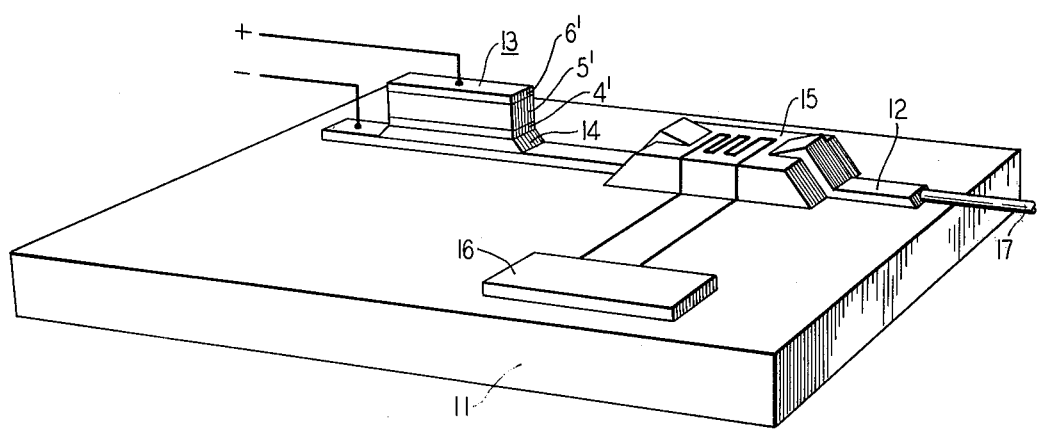
FIG. 2 shows a pictorial view of an integrated optical circuit including magnetic and optical devices.

In FIG. 2, an integrated-optics device for generating an optical carrier, modulating the carrier and transmitting the modulated carrier into a fiber-optic waveguide is shown in which substrate 11 and thin film waveguide 12 are formed of a garnet and a III-V compound respectively, with lattice constants adjusted for an integral ratio.

Laser 13 is another version of the semiconductor injection laser known as the twin-guide laser, in which laser light generated in active layer 14 is coupled to waveguide 12 below, through a tapered transition. Waveguide 12 also serves as one of the electric contacts of the laser. Layers 4', 5', and 6' are the same as layers 4, 5, and 6 in FIG. 1. The radiation from laser 13 then travels through waveguide 12 into and out of a magnetooptic switch 15 which is formed from a garnet-based material directly on garnet substrate 11. The method of the coupling using tapered edges of the films and the magnetooptic switch described here are earlier inventions of this inventor (U.S. Pat. Nos. 3,764,195 and 4,806,226). The laser, switch and waveguides of various shapes can be grown on the garnet substrate by the method of "selective growth" which is well known in epitaxial technology. Switch 15, controlled by electronics logic circuit 16, illustratively a time-division multiplexer that combines input bit streams (arriving on contacts not shown), forms a modulated radiation beam that continues through waveguide 12 to optical fiber 17 for transmission.

Figure 2A:
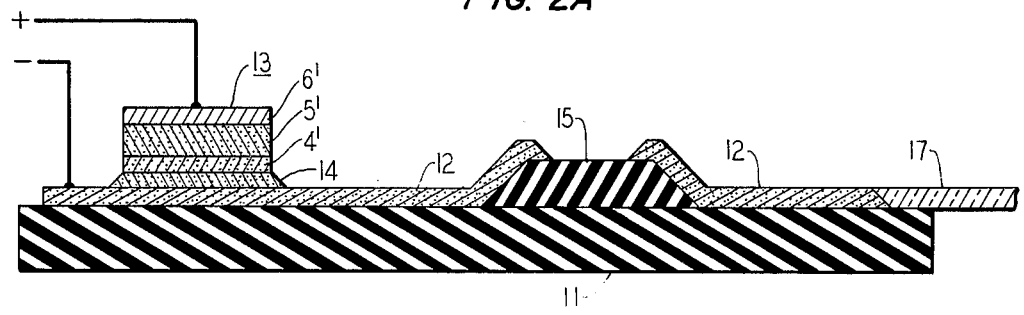
FIG. 2A shows a section through FIG. 2.

FIG. 2A shows a section along waveguide 12 through the centerline of devices 13 and 15 and of waveguide 12, indicating by cross-hatching the garnet and semiconductor components of the device. In particular, active region 14 of laser 13 and waveguide 12 are both formed from III-V semiconductors (differently doped), and magnetooptic switch 15 and substrate 11 are formed from garnet-based compounds.

Figure 3:
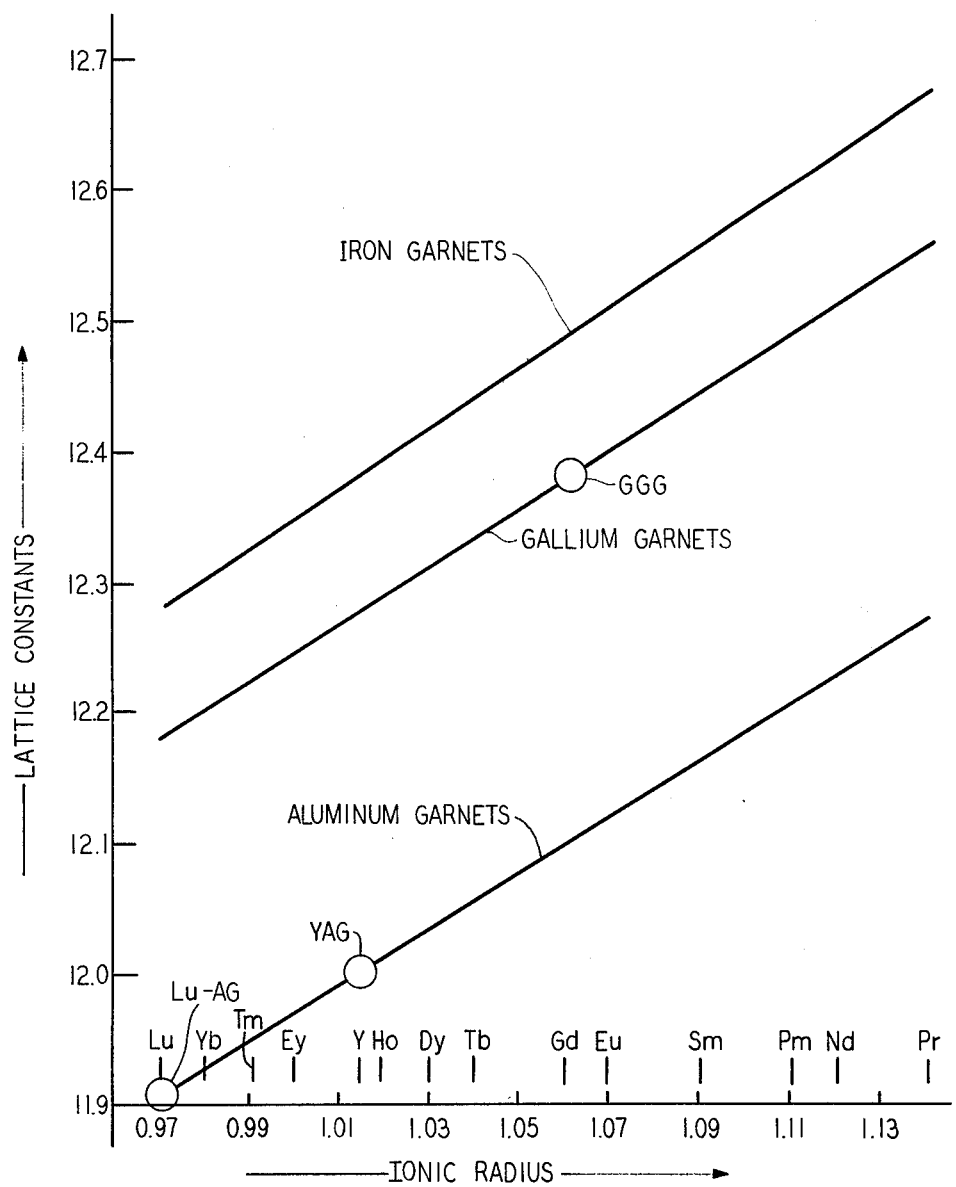
FIG. 3 shows a plot of the lattice constants of the iron, aluminum and gallium garnets against ionic radius of the added rare-earth element.

FIG. 3 shows a graph plotting the lattice constants of all the iron, gallium and aluminum garnets against ionic radius of the added rare-earth element. Individual elements are indicated at the appropriate ionic radius, and the positions of three well-known garnets are indicated by circles 13 GGG (Gd — Ga — Garnet), YAG (Y — Al — Garnet) and LuAg (Lu — Al — Garnet).

The graph provides the numerical value of the lattice constant of a particular garnet compound, so that an appropriate III-V semiconductor may be found to provide an integral ratio of lattice constants. The method of calculating the composition of a III-V compound that has a particular lattice constant is a straightforward application of Vegard's law and is well known in the art. (See *Physics of III-V Compounds,* Madelung and Meyerhofer, Wiley, N.Y., 1964, page 272.)

As an example, combinations of a garnet substrate with a III-V semiconductor compound are indicated in Table I, which shows for each of three garnets the lattice constants of the garnet, a ternary or quaternary III-V semiconductor compound with lattice constant half that of the garnet, and the wavelength of light emitted by a laser formed from that III-V compound. Other combinations of garnets and III-V compounds will be apparent to those skilled in the art.

In addition to the injection laser described above and shown in FIG. 1, optically pumped lasers may be formed from the materials shown in Table I. The garnets are transparent and lossless at wavelengths considered. The indices of refraction differ considerably ($n = 1.8$ or $1.9$ for the garnets, and $n > 3.2$ for the III-V compounds) so that excellent waveguides and lasers can be made.

In addition to the production of solid state lasers, the invention may be used for the production of light-emitting diodes of desired frequency, where the frequency of the light emitted depends on the chemical composition of the device and therefore on the lattice constant.

It is also possible to apply the invention to electrical devices, so that new combinations of compounds will be possible in the fabrication of transistors and other electronic devices.

TABLE I

Wavelengths of III-V Semiconductor Lasers with Lattice Constant Half that of a Garnet III-V Ternary Compounds

| Garnet Compound | | III-V Semiconductor (Compounded for Half the Garnet Lattice Constant) | |
|---|---|---|---|
| Garnet Composition | Lattice Constant | Composition | Wavelength |
| LuAg | 12.91Å | $Al_xIn_{1-x}As$ | 1.19μm |
| | | $InP_xAs_{1-x}$ | 1.24 |
| | | $GaAs_xSb_{1-x}$ | 1.79 |
| | | $InGa_{1-x}As_x$ | 1.90 |
| YAG | 12Å | $Al_xIn_{1-x}As$ | 1.82μm |
| | | $InP_xAs_{1-x}$ | 2 |
| | | $GaAs_xSb_{1-x}$ | 1.87 |
| | | $InGa_{1-x}As_x$ | 2.43 |
| GGG | 12.38Å | $InAs_xSb_{1-x}$ | 6.9μm |

III-V Quarternary Compounds

| Garnet Compound | | III-V Semiconductor (Compounded for Half the Garnet Lattice Constant) | |
|---|---|---|---|
| Garnet Composition | Lattice Constant | Composition | Wavelength |
| LuAg | 12.91Å | $(Al_xIn_{1-x})_yGa_{1-y}As$ | 1.19 – 1.90μm |
| | | $Al_xIn_{1-x}P_yAs_{1-y}$ | 1.19 – 1.24 |
| YAG | 12Å | $(Al_xIn_{1-x})_yGa_{1-y}As$ | 1.82 – 2.43μm |
| | | $Al_xIn_{1-x}P_yAs_{1-y}$ | 1.82 – 2 |
| GGG | 12.38Å | $(Al_xGa_{1-x})_yIn_{1-y}Sb$ | 1.16 – 1.29μm |
| | | $Al_xIn_{1-x}As_ySb_{1-y}$ | .79 – 3.44 |

What is claimed is:

1. An article of manufacture comprising a first crystalline layer formed from a garnet compound having a first lattice constant $A_1$, and
   a second crystalline layer formed from a compound comprising elements from groups III and V of the Periodic Table of the Elements formed on said first crystalline layer having a second lattice constant $A_2$, said first and second lattice constants forming two ratios $A_1/A_2$ and $A_2/A_1$, only one of which two ratios is substantially equal to an integer, said second crystalline layer being grown epitaxially onto at least a portion of said first crystalline layer.

2. An electrical device comprising a first crystalline layer formed from a garnet compound having a first lattice constant $A_1$,
   a second crystalline layer formed from a compound comprising elements from groups III and V of the Periodic Table of the Elements having a second lattice constant $A_2$, said first and second lattice constants forming two ratios $A_1/A_2$ and $A_2/A_1$, only one of which two ratios is substantially equal to an integer, said second crystalline layer being grown epitaxially onto a portion of said substrate, and
   means for passing electrical signals through at least one of said crystalline layers.

3. An integrated-optics apparatus comprising a first layer formed from a garnet compound having a first lattice constant $A_1$,
   a second layer formed from a compound comprising elements from groups III and V of the Periodic Table of the Elements having a second lattice constant $A_2$, which two lattice constants form two ratios $A_1/A_2$ and $A_2/A_1$, only one of which two ratios is substantially equal to an integer, said second layer being grown epitaxially onto a portion of said first layer, at least two optical devices, one of said optical devices being epitaxially grown directly onto said first layer and a second one of said optical devices being epitaxially grown onto said second layer.

4. An integrated-optics device according to claim 3 in which said one of said optical devices is an magnetooptical device.

5. An integrated-optics device according to claim 3 in which said second one of said optical devices is an electrooptical device.

6. An integrated-optics apparatus according to claim 3, wherein said second one of said optical devices is a solid-state laser for producing and coupling a beam of radiation into said second layer and said one of said optical devices is a magnetooptic switch for modulating said beam of radiation.

* * * * *